(12) United States Patent
Cheng et al.

(10) Patent No.: US 10,673,397 B2
(45) Date of Patent: Jun. 2, 2020

(54) OPERATIONAL AMPLIFIER

(71) Applicant: NOVATEK Microelectronics Corp., Hsin-Chu (TW)

(72) Inventors: Jhih-Siou Cheng, New Taipei (TW); Tzong-Honge Shieh, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 245 days.

(21) Appl. No.: 15/688,899

(22) Filed: Aug. 29, 2017

(65) Prior Publication Data
US 2018/0254758 A1 Sep. 6, 2018

Related U.S. Application Data

(60) Provisional application No. 62/465,165, filed on Mar. 1, 2017.

(51) Int. Cl.
*H03F 3/18* (2006.01)
*H03F 3/26* (2006.01)
*H03F 3/21* (2006.01)
*H03F 3/30* (2006.01)
*G09G 3/36* (2006.01)
*H03F 3/72* (2006.01)
*H03F 3/68* (2006.01)

(52) U.S. Cl.
CPC ............ *H03F 3/26* (2013.01); *G09G 3/3688* (2013.01); *H03F 3/211* (2013.01); *H03F 3/3022* (2013.01); *H03F 3/68* (2013.01); *H03F 3/72* (2013.01); *G09G 3/3696* (2013.01); *G09G 2310/027* (2013.01); *G09G 2310/0291* (2013.01); *H03F 3/3001* (2013.01)

(58) Field of Classification Search
CPC ..... H03F 3/26; H03F 3/72; H03F 3/68; H03F 3/211; H03F 3/3022; H03F 3/3076; H03F 3/3066; H03F 3/3071; H03F 3/3001; H03F 3/345; G09G 3/3688; G09G 3/3696; G09G 2310/027; G09G 2310/0291
USPC .................................................. 330/263, 264
See application file for complete search history.

(56) References Cited

U.S. PATENT DOCUMENTS

| | | | |
|---|---|---|---|
| 5,530,400 A | 6/1996 | Hoang | |
| 7,330,069 B2* | 2/2008 | Yamamura | H03F 1/26 330/10 |
| 7,768,347 B2* | 8/2010 | De Cremoux | H03F 3/217 330/207 A |
| 8,076,971 B2* | 12/2011 | Kim | H03F 3/217 330/10 |
| 8,643,436 B2* | 2/2014 | Ni | H03F 3/217 330/207 A |

(Continued)

*Primary Examiner* — Khanh V Nguyen
(74) *Attorney, Agent, or Firm* — Winston Hsu

(57) ABSTRACT

An operational amplifier includes an output node; an output stage, comprising a plurality of output current paths and a plurality of control nodes, wherein the plurality of control nodes are respectively coupled to the plurality of output current paths, and the plurality of output current paths are coupled to the output node and respectively coupled to a plurality of power supply sources providing different voltages; and a selecting unit, configured to couple an internal output node of the operational amplifier to one of the plurality of control nodes of the output stage.

9 Claims, 5 Drawing Sheets

(56) References Cited

U.S. PATENT DOCUMENTS

| | | | |
|---|---|---|---|
| 8,981,844 B2* | 3/2015 | Li | ................. H03F 3/2171 330/10 |
| 2012/0049930 A1 | 3/2012 | Han | |
| 2015/0009202 A1 | 1/2015 | Cho | |
| 2016/0240155 A1 | 8/2016 | Yang | |

* cited by examiner

| $V_{IN}$ | VDD~VSP1 | | VSP1~VSN1 | | | | VSN1~VEE | |
|---|---|---|---|---|---|---|---|---|
| Output stage | M1A & M2A | M1A & M2B | M1A & M2A | M1A & M2B | M1B & M2A | M1B & M2B | M1A & M2A | M1B & M2B |
| $N_{1A}$ | $V_{T1}$ | $V_{T1}$ | $V_{T1}$ | $V_{T1}$ | Pull H | Pull H | $V_{T1}$ | Pull H |
| $N_{1B}$ | Pull H | Pull H | Pull H | Pull H | $V_{T1}$ | $V_{T1}$ | Pull H | $V_{T1}$ |
| $N_{2A}$ | $V_{T2}$ | Pull L | $V_{T2}$ | Pull L | $V_{T2}$ | Pull L | $V_{T2}$ | $V_{T2}$ |
| $N_{2B}$ | Pull L | $V_{T2}$ | Pull L | $V_{T2}$ | Pull L | $V_{T2}$ | Pull L | Pull L |

OPERATIONAL AMPLIFIER

CROSS REFERENCE TO RELATED APPLICATIONS

This application claims the benefit of U.S. Provisional Application No. 62/465,165 filed on Mar. 1, 2017, the contents of which are incorporated herein by reference.

BACKGROUND OF THE INVENTION

1. Field of the Invention

The present invention relates to an operational amplifier for a display driving circuit, and more particularly, to an operational amplifier with multiple output current paths.

2. Description of the Prior Art

With development of display resolution, such as full HD or 4K resolution, the charging period for a pixel unit keeps being reduced. Because of the reduced charging period, conventional solutions to reduce power consumption, such as a pre-charge technique, may be less effective for the display driving circuit of a high-resolution display device. When using the pre-charge technique, the display driving circuit spends a specific period within the charging period to pre-charge its output node to a predetermined voltage before outputting the target voltage. The time performing pre-charge operation in each charging period has to be long enough to pre-charge the output node to the predetermined voltage, otherwise the power consumption would not be reduced effectively.

However, when the charging period is shorter as the display resolution continuously increasing, the ratio of time occupied by the pre-charging operations within each charging period becomes greater. Under such a condition, the display driving circuit may not achieve the target voltage in time. Thus, a power saving scheme for short charging period becomes a topic to be discussed.

SUMMARY OF THE INVENTION

In order to solve the above issue, the present invention provides an operational amplifier with multiple output current paths.

According of an embodiment of the present invention, an operational amplifier is provided. The operational amplifier comprises an output node; an output stage, comprising a plurality of output current paths and a plurality of control nodes, wherein the plurality of control nodes are respectively coupled to the plurality of output current paths, and the plurality of output current paths are coupled to the output node and respectively coupled to a plurality of power supply sources providing different voltages; and a selecting unit, configured to couple an internal output node of the operational amplifier to one of the plurality of control nodes of the output stage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
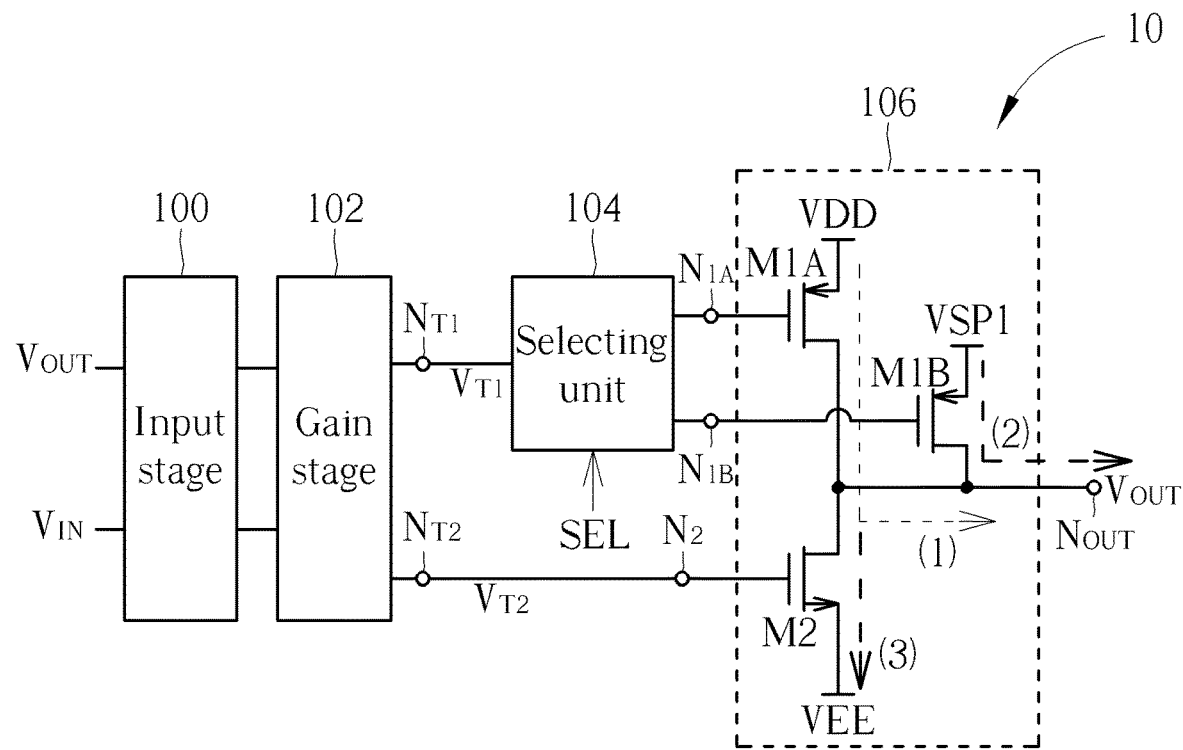
FIG. 1 is a schematic diagram of an operational amplifier according to an embodiment of the present invention.

Please refer to FIG. 1, which is a schematic diagram of an operational amplifier 10 according to an embodiment of the present invention. The operational amplifier 10 is a voltage follower and may be utilized as an output buffer in a display driving circuit of a display panel. The operational amplifier 10 may generate an output current $I_{OUT}$ outputted through an output node $N_{OUT}$, wherein the output current $I_{OUT}$ is generated according to a differential input voltage that is the difference between an input voltage $V_{IN}$ inputted to the operational amplifier 10 from a digital-to-analog converter (DAC) in the display driving circuit and the voltage level at the output node $N_{OUT}$, called the output voltage $V_{OUT}$ hereinafter. The output current $I_{OUT}$ is a supply current (or called charging current) or a sink current (or called discharging current) with respect to a load (e.g., a pixel unit in a display panel, not shown in FIG. 1) coupled to the output node $N_{OUT}$, such that the output voltage $V_{OUT}$ may follow the input voltage $V_{IN}$. The input voltage $V_{IN}$ is corresponding to a gray level to be displayed in the pixel unit.

The operational amplifier 10 includes an input stage 100, a gain stage 102, a selecting unit 104, and an output stage 106. The input stage 100 receives the input voltage $V_{IN}$ and a feedback voltage which is the output voltage $V_{OUT}$. The input stage 100 may generate differential output signals according to the differential input voltage ($V_{IN}$-$V_{OUT}$).

The gain stage 102 is coupled to the input stage 100 and internal output nodes $N_{T1}$ and $N_{T2}$ of the operational amplifier 10. The gain stage 102 is utilized for generating a first control voltage $V_{T1}$ and a second control voltage $V_{T2}$ according to the differential output signals generated by the input stage 100. The first control voltage $V_{T1}$ and the second control voltage $V_{T2}$ are respectively outputted through the internal output nodes $N_{T1}$ and $N_{T2}$.

The selecting unit 104 is coupled to the internal output node $N_{T1}$ and is utilized for selectively coupling the internal output node $N_{T1}$ to one of two first control nodes $N_{1A}$ and $N_{1B}$ of the output stage 106 according to a selecting signal SEL. By using the selecting unit 104, the first control voltage $V_{T1}$ may be transmitted to the output stage 106. The first control voltage $V_{T1}$ and the second control voltage $V_{T2}$ control the output stage 106 to output the output current $I_{OUT}$.

The selecting signal SEL may be generated according to a digital display data converted into the input voltage $V_{IN}$ to be outputted to the operational amplifier 10. In an example, the selecting signal SEL may be generated according to the most significant bit of the digital display data. In this example, the first control voltage $V_{T1}$ is transmitted via the selecting unit 104 to the first control node $N_{1A}$ if the selecting signal SEL indicates the most significant bit of the digital display data is 1; otherwise, the first control voltage $V_{T1}$ is transmitted via the selecting unit 104 to the first control node $N_{1B}$ if the selecting signal SEL indicates the most significant bit of the digital display data is 0. Based on the example using the most significant bit of the digital display data to generate the selecting signal SEL, an exemplary circuit for generating the selecting signal SEL may include a level shifter to convert the most significant bit of the digital display data to a higher voltage level proper to be applied in the operational amplifier 10. Another example of generating the selecting signal SEL may be given in the later description.

The output stage 106 may be a class AB output stage. The output stage 106 includes the first control nodes $N_{1A}$ and $N_{1B}$ coupled to the selecting unit 104, and includes a second control node $N_2$ coupled to the internal output node $N_{T2}$. The output stage 106 includes two output current paths, denoted as path (1) and path (2) in FIG. 1. The output current path (1) is coupled between a power supply source supplying a voltage VDD and the output node $N_{OUT}$ and coupled to the first control node $N_{1A}$. The output current path (2) is coupled between a power supply source supplying a voltage VSP1 and the output node $N_{OUT}$ and coupled to the first control node $N_{1B}$. The output stage 106 also includes a current path (3) coupled between the output node $N_{OUT}$ and a power supply source supplying a voltage VEE and coupled to the second control node $N_2$. The voltage VSP1 is lower than the voltage VDD, and the voltage VSP1 may be a constant voltage such as (½)*VDD or (¾)*VDD, or a variable voltage. The voltage VEE may be lower than the voltages VDD and VSP1.

One of the first control nodes $N_{1A}$ and $N_{1B}$ which is selected according to the selecting signal SEL receives the first control voltage $V_{T1}$, and the first control voltage $V_{T1}$ controls the selected one of the output current paths (1) and (2). The second control node $N_2$ receives the second control voltage $V_{T2}$ from the gain stage 102 to control the current path (3).

One of the output current paths (1) and (2) may be selected according to the selecting signal SEL to provide the output current $I_{OUT}$ to the load, in a condition that a current input voltage $V_{IN,t}$ corresponding to a current digital display data D[t] is higher than the output voltage $V_{OUT}$ which follows an input voltage $V_{IN,t-1}$ corresponding to a previous digital display data D[t−1], wherein t indicates a timing order. In this condition ($V_{IN,t} > V_{IN,t-1}$), the voltage level at the output node $N_{OUT}$ may be increased to reach the current input voltage $V_{IN,t}$. There is still a current flowing though the current path (3) to the power supply source supplying VEE when the output current path (1) or (2) outputs the supply current.

Therefore, the operational amplifier 10 has a selected output current path, selected from multiple output current paths each capable of providing a supply current. It is noted that the output current path(s) not selected is configured to not conducted, i.e., not to provide a supply current, when the selected output current path provides the supply current.

The current path (3) may provide the output current $I_{OUT}$ drained from the load, in a condition that the current input voltage $V_{IN,t}$ corresponding to the current digital display data D[t] is lower than the output voltage $V_{OUT}$ which follows the input voltage $V_{IN,t-1}$ corresponding to the previous digital display data D[t−1]. In this condition ($V_{IN,t} < V_{IN,t-1}$), the voltage level at the output node $N_{OUT}$ may be decreased to reach the current input voltage $V_{IN,t}$.

Each of the output current paths (1) and (2) may include one or more transistors. In the output stage 106 shown in FIG. 1, the output current paths (1) and (2) respectively include PMOS transistors M1A and M1B. The first control node $N_{1A}$ is coupled to the gate of the PMOS transistor M1A and the first control node $N_{1B}$ is coupled to the gate of the PMOS transistor M1B. The current path (3) includes a NMOS transistor M2, and the second control node $N_2$ is coupled to the gate of the NMOS transistor M2.

In another example, the selecting signal SEL may be generated according to a determination result that is generated by determining a voltage range where the current input voltage $V_{IN,t}$ corresponding to the current digital display data D[t] is. For example, the current input voltage $V_{IN,t}$ is compared with the voltage VSP1. It is noted that the determination result indicating $V_{IN,t} \geq VSP1$ or $V_{IN,t} < VSP1$ may be generated by comparing analog voltages, i.e., comparing the current input voltage $V_{IN,t}$ and the voltage VSP1, or, may be generated by comparing the current digital display data corresponding to the current input voltage $V_{IN,t}$ and a digital value corresponding to the voltage VSP1.

When $V_{IN,t} \geq VSP1$, the selecting unit 104 selectively couples the internal output node $N_{T1}$ to the first control node $N_{1A}$ (e.g., the gate of the PMOS transistor M1A) according to the selecting signal SEL which indicates $V_{IN,t} \geq VSP1$. The first control voltage $V_{T1}$ and the second control voltage $V_{T2}$ respectively control the PMOS transistor M1A and the NMOS transistor M2 to be in the active state (and whatever M1A and M2 is in triode region or saturation region is not limited), so that a current output current $I_{OUT,t}$ is generated. Whether the current output current $I_{OUT,t}$ is a supply current or a sink current is determined according to the voltage difference between the current input voltage $V_{IN,t}$ and the previous input voltage $V_{IN,t-1}$. When the PMOS transistor M1A is in the active state, the selecting unit 104 or other circuit may control the first control node $N_{1B}$ to be pulled high to make the PMOS transistor M1B be in the cutoff state.

When $V_{IN,t} < VSP1$, the selecting unit 104 selectively couples the internal output node $N_{T1}$ to the first control node $N_{1B}$ (e.g., the gate of the PMOS transistor M1B) according to the selecting signal SEL which indicates $V_{IN,t} < VSP1$. The first control voltage $V_{T1}$ and the second control voltage $V_{T2}$ respectively control the PMOS transistor M1B and the NMOS transistor M2 to be in the active state, so that the current output current $I_{OUT,t}$ is generated. When the PMOS transistor M1B is in the active state, the selecting unit 104 or other circuit may control the first control node $N_{1A}$ to be pulled high to make the PMOS transistor M1A be in the cutoff state.

When $V_{IN,t} \geq VSP1$ and the current output current $I_{OUT,t}$ is a supply current to the load by the output current path (1), the power consumption of charging to the load, denoted as P1, is expressed by the following equation:

$$P1 = C_L \times V_{D1} \times V_{DIFF} \quad (E1)$$

wherein $V_{D1}$ is the voltage VDD, $C_L$ is the equivalent capacitance of the load (i.e., pixel unit), and $V_{DIFF}$ is the voltage difference between the current input voltage $V_{IN,t}$ and the previous input voltage $V_{IN,t-1}$.

When $V_{IN,t} < VSP1$ and the output current is a supply current to the load by the output current path (2), the power consumption of charging to the load, denoted as P2, is expressed by the following equation:

$$P2 = C_L \times V_{D2} \times V_{DIFF} \quad (E2)$$

wherein $V_{D2}$ is the voltage VSP1, which is lower than the voltage VDD. From the above, the power consumption P2 may be less than the power consumption P1 in a condition that the voltage difference $V_{DIFF}$ in the equation E1 equals that in the equation E2.

Therefore, by using the operational amplifier 10, the power consumption of charging to the load may be reduced adaptively according to the input voltage of the operational amplifier 10. In other words, the power consumption of charging to the load may be reduced adaptively according to the digital display data. The conventional pre-charge techniques may be not suitable for a display panel of higher resolution and short charging period. By using the operational amplifier 10 in the display driving circuit, a charging period does not need to be divided into two sub-periods (i.e., a pre-charge period and a regular charging period) so the conventional pre-charge circuit may be not necessary.

Figure 2:
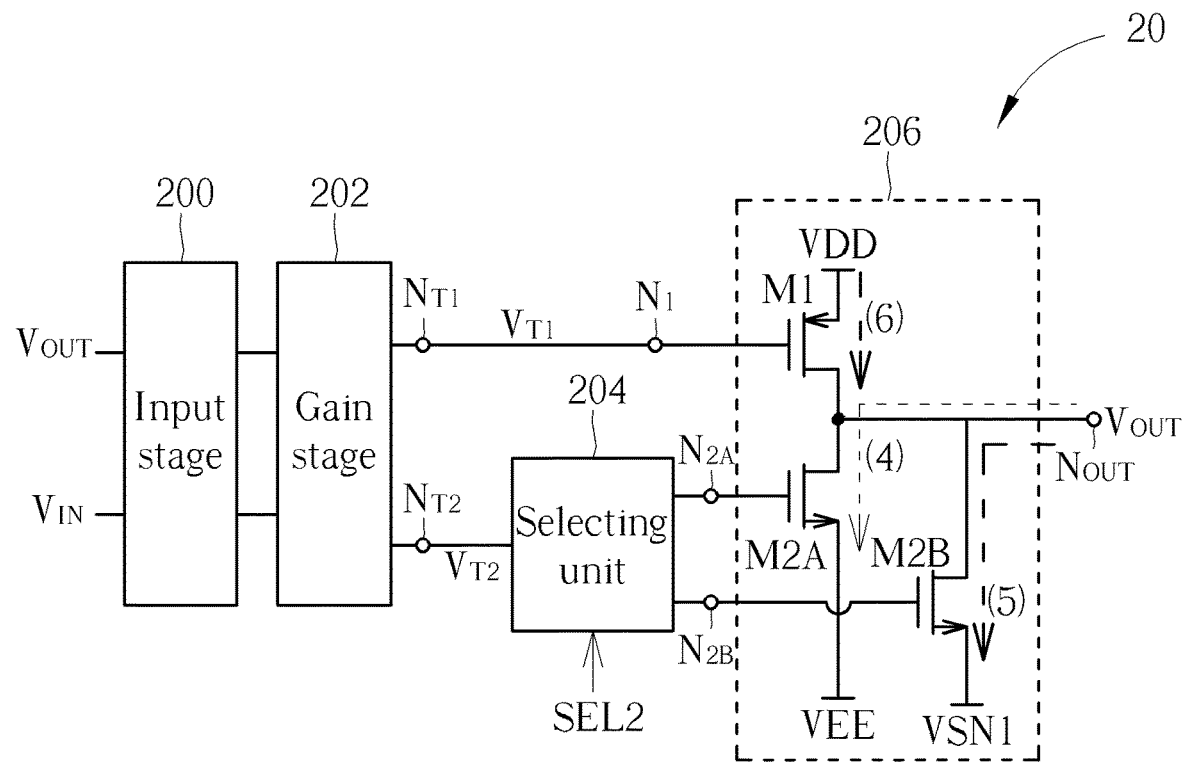
FIG. 2 is a schematic diagram of an operational amplifier according to an embodiment of the present invention.

Please refer to FIG. 2, which is an operational amplifier 20 according to an embodiment of the present invention. The operational amplifier 20 includes an input stage 200, a gain stage 202, a selecting unit 204, and an output stage 206. The operational amplifier 20 further includes internal output nodes $N_{T1}$ and $N_{T2}$. The input stage 200 and the gain stage 202 may be similar to the input stage 100 and the gain stage 102 of FIG. 1, and related description is not repeated herein.

The selecting unit 204 is coupled to the internal output node $N_{T2}$ and is utilized for selectively coupling the internal output node $N_{T2}$ to one of two second control nodes $N_{2A}$ and $N_{2B}$ of the output stage 206 according to a selecting signal SEL2. By using the selecting unit 204, the second control voltage $V_{T2}$ may be transmitted to the output stage 206. The first control voltage $V_{T1}$ and the second control voltage $V_{T2}$ control the output stage 206 to output the output current $I_{OUT}$.

The selecting signal SEL2 may be generated according to a digital display data converted into the input voltage $V_{IN}$ to be outputted to the operational amplifier 20. In an example, the selecting signal SEL2 may be generated according to the most significant bit of the digital display data. In this example, the second control voltage $V_{T2}$ is transmitted via the selecting unit 204 to the second control node $N_{2A}$ when the selecting signal SEL2 indicates the most significant bit of the digital display data is 1; otherwise, the second control voltage $V_{T2}$ is transmitted via the selecting unit 204 to the second control node $N_{2B}$ when the selecting signal SEL2 indicates the most significant bit of the digital display data is 0. Another example of generating the selecting signal SEL2 may be given in the later description.

The output stage 206 may be a class AB output stage. The output stage 206 includes the second control nodes $N_{2A}$ and $N_{2B}$ coupled to the selecting unit 204, and includes a first control node $N_1$ coupled to the internal output node $N_{T1}$. The output stage 206 includes two output current paths, denoted as path (4) and path (5) in FIG. 2. The output current path (4) is coupled between the output node $N_{OUT}$ and a power supply source supplying a voltage VEE and coupled to the second control node $N_{2A}$. The output current path (5) is coupled between the output node $N_{OUT}$ and a power supply source supplying a voltage VSN1 and coupled to the second control node $N_{2B}$. The output stage 206 also includes a current path (6) coupled between a power supply source supplying a voltage VDD and the output node $N_{OUT}$ and coupled to the first control node $N_1$. The voltage VEE may be lower than the voltage VDD. The voltage VSN1 is higher than the voltage VEE and is lower than the voltage VDD, and the voltage VSN1 may be a constant voltage or a variable voltage.

One of the second control nodes $N_{2A}$ and $N_{2B}$ which is selected according to the selecting signal SEL2 receives the second control voltage $V_{T2}$, and the second control voltage $V_{T2}$ controls the selected one of the output current paths (4) and (5). The first control node $N_1$ receives the first control voltage $V_{T1}$ from the gain stage 202 to control the current path (6).

One of the output current paths (4) and (5) may be selected according to the selecting signal SEL2 to provide the output current LOUT which is drained from the load, in a condition that a current input voltage $V_{IN,t}$ corresponding to a current digital display data D[t] is lower than the output voltage $V_{OUT}$ which follows an input voltage $V_{IN,t-1}$ corresponding to a previous digital display data D[t−1]. In this condition ($V_{IN,t}<V_{IN,t-1}$), the voltage level at the output node $N_{OUT}$ may be decreased to reach the current input voltage $V_{IN,t}$. There is still a current flowing though the current path (6) from the power supply source supplying VDD when the output current path (4) or (5) outputs the sink current.

Therefore, the operational amplifier 20 has a selected output current path, selected from multiple output current paths each capable of providing a sink current. It is noted that the output current path (s) not selected is configured to not conducted, i.e., not to provide a sink current, when the selected output current path provides the sink current.

The current path (6) may provide the output current $I_{OUT}$ supplied to the load, in a condition that a current input voltage $V_{IN,t}$ corresponding to a current digital display data D[t] is higher than the output voltage $V_{OUT}$ which follows the input voltage $V_{IN,t-1}$ corresponding to a previous digital display data D[t−1]. In this condition ($V_{IN,t}>V_{IN,t-1}$), the voltage level at the output node $N_{OUT}$ may be increased to reach the current input voltage $V_{IN,t}$.

Each of the output current paths (4) and (5) may include one or more transistors. In the output stage 206, the output current paths (4) and (5) respectively include NMOS transistors M2A and M2B. The second control node $N_{2A}$ is coupled to the gate of the NMOS transistor M2A and the second control node $N_{2B}$ is coupled to the gate of the NMOS transistor M2B. The current path (6) includes a PMOS transistor M1, and the first control node $N_1$ is coupled to the gate of the PMOS transistor M1.

In another example, the selecting signal SEL2 may be generated according to a determination result that is generated by determining a voltage range where the current input voltage $V_{IN,t}$ corresponding to the current digital display data D[t] is. For example, the current input voltage $V_{IN,t}$ is compared with the voltage VSN1. It is noted that the determination result indicating $V_{IN,t}>$VSN1 or $V_{IN,t}\leq$VSN1 may be generated by comparing analog voltages or comparing digital values.

When $V_{IN,t}>$VSN1, the selecting unit 204 selectively couples the internal output node $N_{T2}$ to the second control node $N_{2B}$ (e.g., the gate of the NMOS transistor M2B) according to the selecting signal SEL2 which indicates $V_{IN,t}>$VSN1. The first control voltage $V_{T1}$ and the second control voltage $V_{T2}$ respectively control the PMOS transistor M1 and the NMOS transistor M2B to be in the active state (and whatever M1 and M2B is in triode region or saturation region is not limited), so that a current output current $I_{OUT,t}$ is generated. Whether the current output current $I_{OUT,t}$ is a supply current or a sink current is determined according to the voltage difference between the current input voltage $V_{IN,t}$ and the previous input voltage $V_{IN,t-1}$ When the NMOS transistor M2B is in the active state, the selecting unit 204 or other circuit may control the second control node $N_{2A}$ to be pulled low to make the NMOS transistor M2A be in the cutoff state.

When $V_{IN,t} \leq VSN1$, the selecting unit 204 selectively couples the internal output node $N_{T2}$ to the second control node $N_{2A}$ (e.g., the gate of the NMOS transistor M2A) according to the selecting signal SEL2 which indicates $V_{IN,t} \leq VSN1$. The first control voltage $V_{T1}$ and the second control voltage $V_{T2}$ respectively control the PMOS transistor M1 and the NMOS transistor M2A to be in the active state, so that a current output current $I_{OUT,t}$ is generated. When the NMOS transistor M2A is in the active state, the selecting unit 204 or other circuit may control the second control node $N_{2B}$ to be pulled low to make the NMOS transistor M2B be in the cutoff state.

To compare the power consumption of discharging from the load to the power supply source supplying the voltage VEE and the power consumption of discharging from the load to the power supply source supplying the voltage VSN1, equations may be derived in a similar way as the equations E1 and E2. By using the operational amplifier 20, the power consumption of discharging from the load may be reduced adaptively according to the input voltage the operational amplifier 20. In other words, the power consumption of discharging from the load may be reduced adaptively according to the display data.

Figure 3:
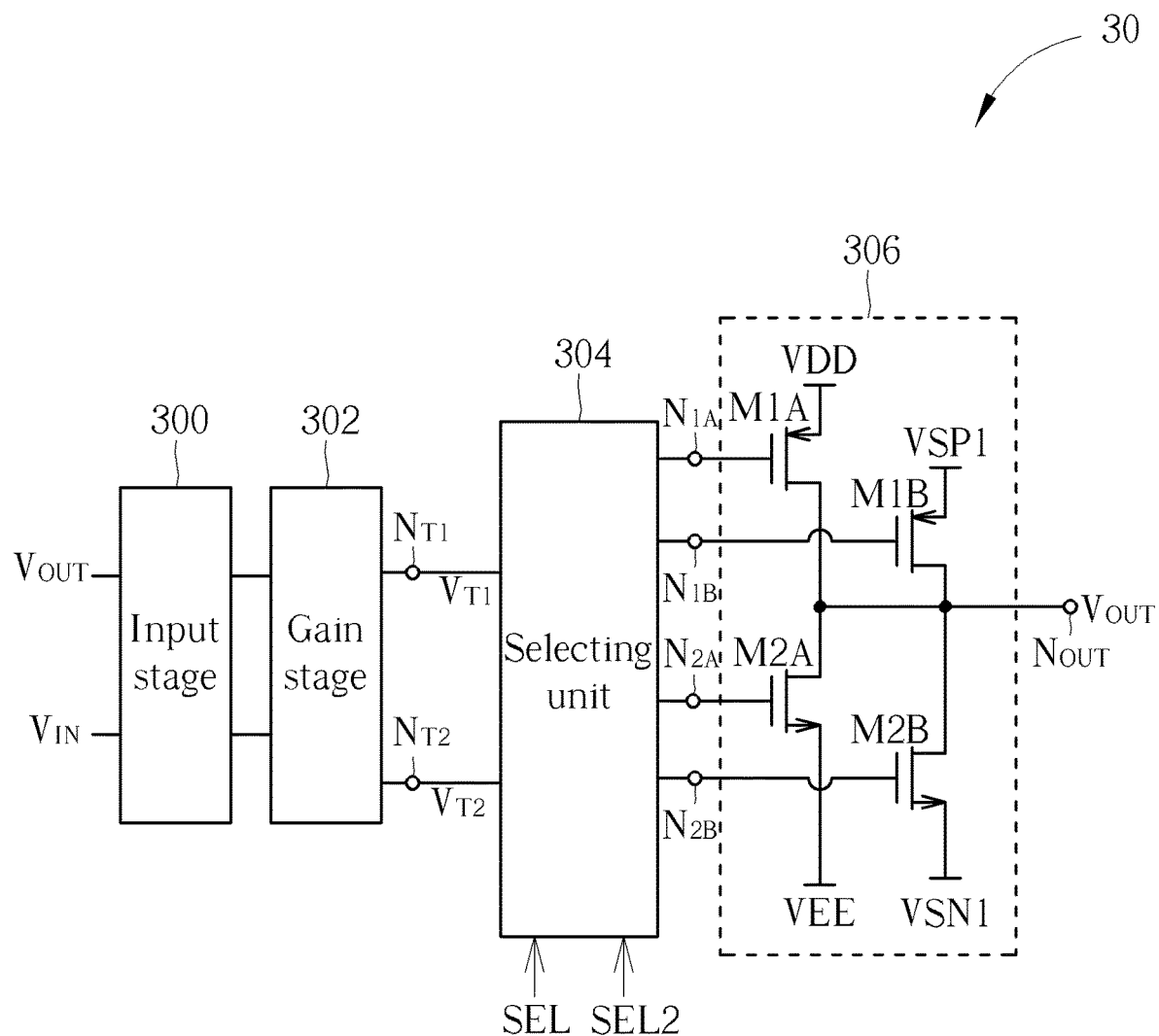
FIG. 3 is a schematic diagram of an operational amplifier according to an embodiment of the present invention.

Please refer to FIG. 3, which is an operational amplifier 30 according to an embodiment of the present invention. The operational amplifier 30 includes an input stage 300, a gain stage 302, a selecting unit 304, and an output stage 306. The operational amplifier 30 further includes internal output nodes $N_{T1}$ and $N_{T2}$. The input stage 300 and the gain stage 302 may be similar to the input stage 100 and the gain stage 102 of FIG. 1.

The output stage 306 includes four output current paths which are similar to the output current paths (1) and (2) (for supply current) in FIG. 1 and the output current paths (4) and (5) (for sink current) in FIG. 2. The power supply sources respectively coupled to the four output current paths are also similar to the illustrated in FIG. 1 and FIG. 2 and related description is not repeated herein. The output current paths for outputting a supply current respectively include PMOS transistors M1A and M1B, and the output current paths for outputting a sink current respectively include NMOS transistors M2A and M2B. The output stage 306 includes two first control nodes $N_{1A}$ and $N_{1B}$ and two second control nodes $N_{2A}$ and $N_{2B}$.

The selecting unit 304 is coupled to the internal output nodes $N_{T1}$ and $N_{T2}$ and is utilized for selectively coupling the internal output node $N_{T1}$ to one of the first control nodes $N_{1A}$ and $N_{1B}$ according to a selecting signal SEL. The first control voltage $V_{T1}$ outputted from the gain stage 302 is used as the gate bias of the PMOS transistor M1A or M1B. The selecting unit 304 is also utilized for selectively coupling the internal output node $N_{T2}$ to one of the second control nodes $N_{2A}$ and $N_{2B}$ according to a selecting signal SEL2. The second control voltage $V_{T2}$ outputted from the gain stage 302 is used as the gate bias of the NMOS transistor M2A or M2B.

Figures 4, 5:
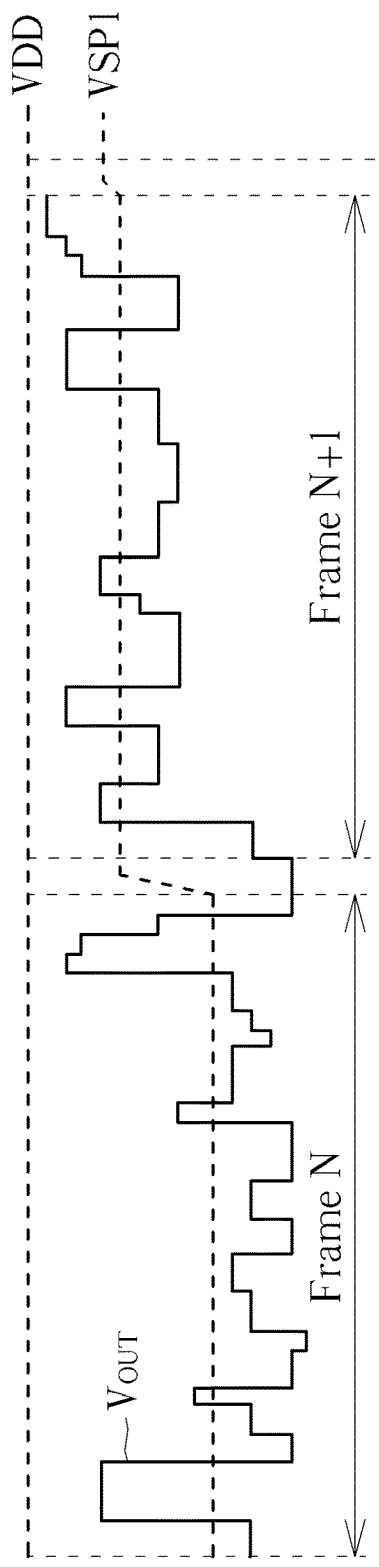
FIG. 4 is a table illustrating the input voltage, the composition of the output stage and corresponding bias of the output stage of the operational amplifier of FIG. 3.
FIG. 5 is a timing diagram of an output voltage of an operational amplifier according an embodiment of the present invention.

Please refer to FIG. 4, which is a table of the voltage range that the input voltage $V_{IN}$ of the operational amplifier 30 falls in, the composition of the output stage 306, and corresponding gate bias of the transistors M1A, M1B, M2A and M2B. The selecting signals SEL and SEL2 may be generated according to a determination result that is generated by determining a voltage range where the current input voltage $V_{IN,t}$ is. The current input voltage $V_{IN,t}$ is remarked as $V_{IN}$ in the table.

When $VDD > V_{IN} \geq VSP1$, the selecting unit 304 couples the internal output node $N_{T1}$ to the first control node $N_{1A}$ and the first control voltage $V_{T1}$ controls the PMOS transistor M1A (coupled to VDD) to be in the active state; and in this condition, it is workable whatever the selecting unit 304 couples the internal output node $N_{T2}$ to the second control node $N_{2A}$ or the second control node $N_{2B}$, which means either the NMOS transistor M2A or the NMOS transistor M2B is in the active state. The PMOS transistor and the NMOS transistor those are in the unselected paths are in the cutoff state.

When $VSP1 > V_{IN} > VSN1$, it is workable whatever the selecting unit 304 couples the internal output node $N_{T1}$ to the first control node $N_{1A}$ or the first control node $N_{1B}$, which means either the PMOS transistor M1A (coupled to VDD) or the PMOS transistor M1B (coupled to VSP1) is in the active state; and it is workable whatever the selecting unit 304 couples the internal output node $N_{T2}$ to the second control node $N_{2A}$ or the second control node $N_{2B}$, which means either the NMOS transistor M2A (coupled to VEE) or the NMOS transistor M2B (coupled to VSN1) is in the active state.

When $VSN1 \geq V_{IN} > VEE$, the selecting unit 304 couples the internal output node $N_{T2}$ to the second control node $N_{2A}$ and the second control voltage $V_{T2}$ controls the NMOS transistor M2A (coupled to VEE) to be in the active state; and in this condition, it is workable whatever the selecting unit 304 couples the internal output node $N_{T1}$ to the first control node $N_{1A}$ or the first control node $N_{1B}$, which means either the PMOS transistor M1A or the PMOS transistor M1B is in the active state. The PMOS transistor and the NMOS transistor those are in the unselected paths are in the cutoff state.

By using the operational amplifier 30, the power consumption of charging to the load and the power consumption of discharging from the load may be reduced adaptively according to the digital display data which are converted to the input voltage to the operational amplifier 30. Similar to the operational amplifier 10, the operational amplifier 20 and the operational amplifier 30 also have the benefit of being suitable for the display panel of higher resolution and short charging period.

Please refer to FIG. 5, which is an exemplary timing diagram of the output voltage $V_{OUT}$ of the operational amplifier 10 of FIG. 1. The input voltage $V_{IN}$ may have a similar timing diagram since the output voltage $V_{OUT}$ follows the input voltage $V_{IN}$. FIG. 5 illustrates that the operational amplifier 10 is configured to output only positive output voltages in a frame, which may be one of exemplary application scenarios of the operational amplifier 10. A frame period includes a plurality of charging periods, and for each current charging period (i.e., the period of updating a horizontal display line) the output voltage $V_{OUT}$ may vary or maintain at the same level as in a previous charging period. Take a frame including 1080 horizontal display lines as an example, 1080 digital display data are converted into 1080 input voltages to the operational amplifier 10, and 1080 output voltages are sequentially outputted to the display panel in a frame period. For a frame N, the voltage VSP1 may be determined according to the 1080 digital display data converted into the input voltages to the operational amplifier 10. More specifically, the voltage VSP1 may be determined according to an average of these 1080 digital display data (gray level values) or an average of 1080 luminance values corresponding to these 1080 digital display data. The voltage VSP1 may be a variable voltage and configured frame by frame, as shown in FIG. 5, since the digital display data is variable.

The above method to determine the voltage VSP1 is one of various examples. In another example, the number of digital display data for determining the voltage DSP1 may be all or a part of digital display data for a frame. The voltage VSN1 in the operational amplifier 20 of FIG. 2 may be determined in a similar way.

It is noted that FIG. 1 to FIG. 3 illustrate individual blocks of the input stage, the gain stage, the output stage and the selecting unit for an illustrative purpose only. An operational amplifier according to one of embodiments of the present invention may be illustrated as a two-stages structure including an input stage and an output stage, wherein the output stage or the output stage may provide a current gain. Hence, a selecting unit may be in combination with the output stage, and internal output nodes $N_{T1}$ and $N_{T2}$ may be in the output stage. According to the embodiments of the present invention, the internal output nodes $N_{T1}$ and $N_{T2}$ may be at any proper positions in the operational amplifier as long as voltage signals (or current signals) on those positions are capable of directly or indirectly controlling the gate bias of the PMOS transistor which provides the supply current and the gate bias of the NMOS transistor which provides the sink current.

Figure 6:
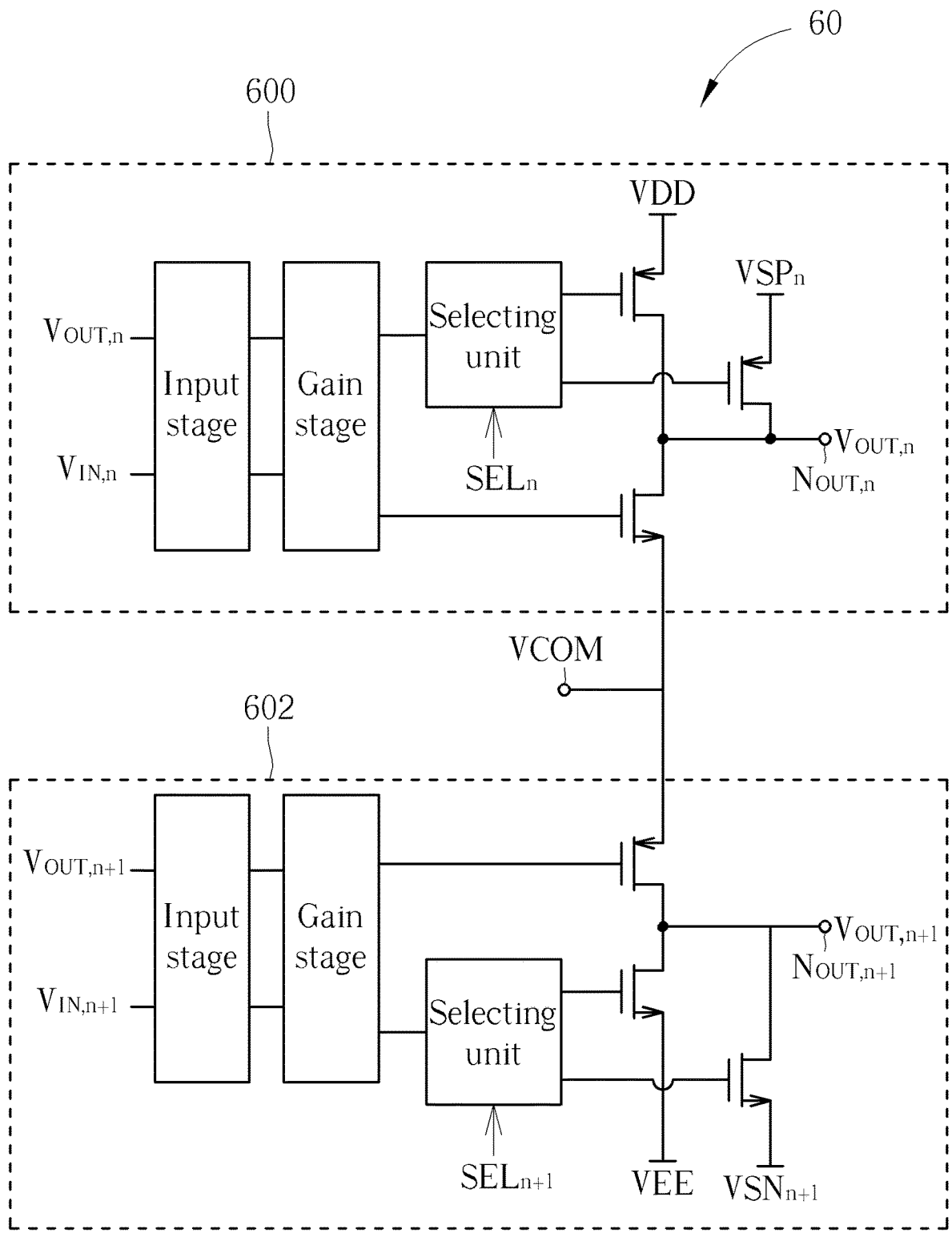
FIG. 6 is a schematic diagram of an output buffer pair according to an embodiment of the present invention.

Please refer to FIG. 6, which is a schematic diagram of an output buffer pair 60 according to an embodiment of the present invention. The output buffer pair 60 may be used in a display driving circuit. The output buffer pair 60 includes operational amplifiers 600 and 602. The operational amplifier 600 has a structure similar to the operational amplifier 10 of FIG. 1 and includes two output current paths among which a supply current path is selected; and the operational amplifier 602 has a structure similar to the operational amplifier 20 and includes two output current paths among which a sink current path is selected. The operational amplifier 600 may receive an input voltage $V_{IN,n}$ and output an output voltage $V_{OUT,n}$ via an output node $N_{OUT,n}$, wherein n denotes an even number or an odd number and the output node $N_{OUT,n}$ may be coupled to an even-numbered output pad or an odd-numbered output pad of the display driving circuit (not shown in FIG. 6). The operational amplifier 602 may receive an input voltage $V_{IN,n+1}$ and output an output voltage $V_{OUT,n+1}$ via an output node $N_{OUT,n+1}$, wherein the output node $N_{OUT,n+1}$ may be coupled to an output pad adjacent to the output pad corresponding to the output node $N_{OUT,n}$. The output voltages $V_{OUT,n}$ and $V_{OUT,n+1}$ are outputted to drive two adjacent pixel units (i.e., subpixels) of a display panel.

In the output buffer pair 60, the voltages VDD and $VSP_n$ are positive voltages and the voltages VEE and $VSN_{n+1}$ are negative voltages. The voltage VCOM may be set to a middle voltage between VDD and VEE. The voltage $VSP_n$ is lower than the voltage VDD and is higher than the voltage VCOM. The voltage $VSN_{n+1}$ is lower than the voltage VCOM and is higher than the voltage VEE. For example, VDD may be +9V, VEE may be −9V, VCOM may be 0V, $VSP_n$ and $VSN_{n+1}$ may be constant voltages, or variable voltages determined based on digital display data.

The selecting unit of the operational amplifier 600 and the selecting unit of the operational amplifier 602 are controlled by respective selecting signals $SEL_n$ and $SEL_{n+1}$. According to the selecting signal $SEL_n$ which is determined based on the input voltage $V_{IN,n}$ (or corresponding digital display data), the operational amplifier 600 may be capable of selectively providing a supply current from the power supply source supplying VDD or from the power supply source supplying $VSP_n$, to a load coupled to the output node $N_{OUT,n}$. According to the selecting signal $SEL_{n+1}$ determined based on the input voltage $V_{IN,n+1}$ (or corresponding digital display data), the operational amplifier 602 may be capable of selectively providing a sink current, from a load coupled to the output node $N_{OUT,n+1}$ to the power supply source supplying VEE or to the power supply source supplying $VSN_{n+1}$. By using the output buffer pair 60 in the display driving circuit, power consumption of charging to the load coupled to the output node $N_{OUT,n}$ and power consumption of discharging from the load coupled to the output node $N_{OUT,n+1}$ may be reduced.

Figure 7:
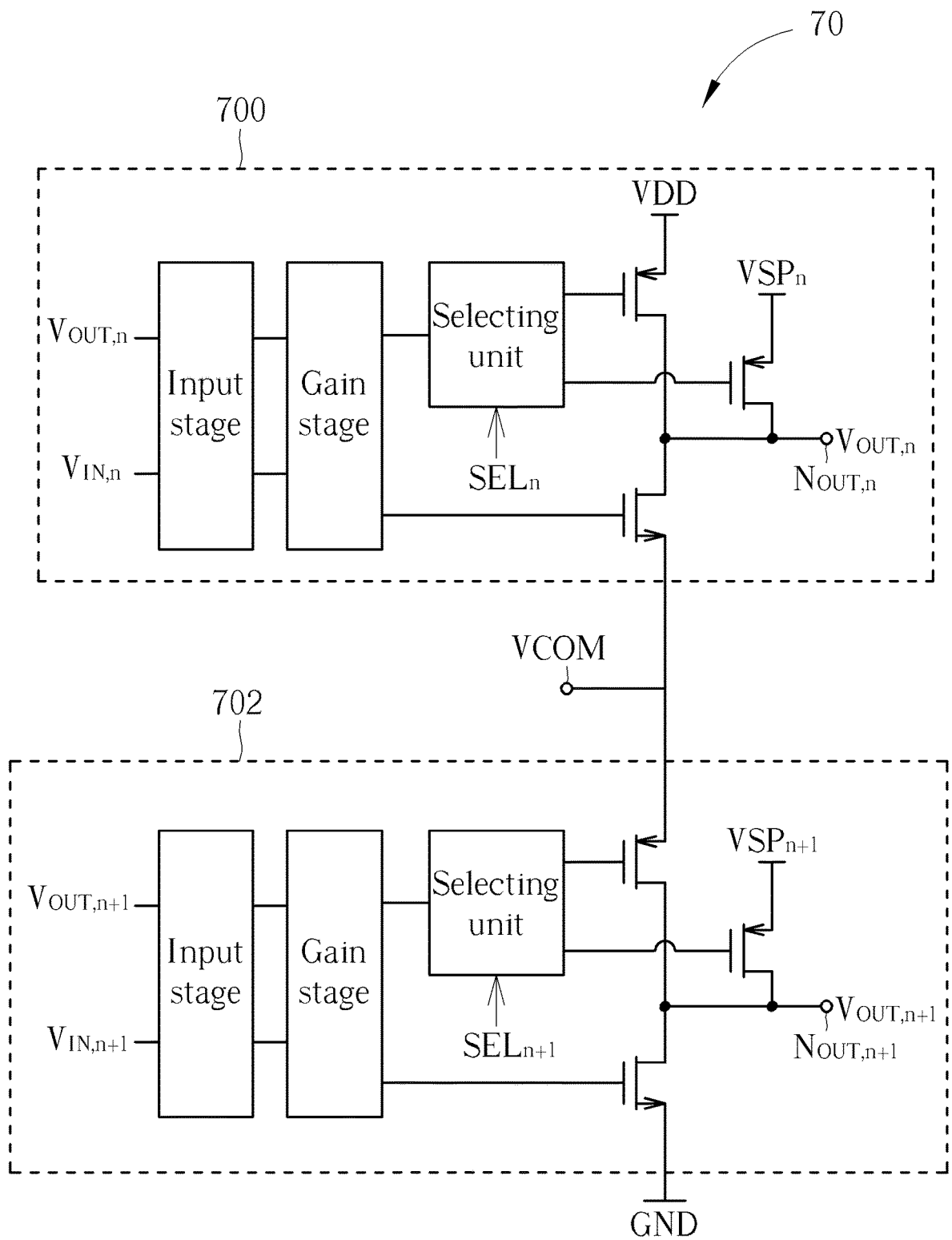
FIG. 7 is a schematic diagram of an output buffer pair according to an embodiment of the present invention.

Please refer to FIG. 7, which is a schematic diagram of an output buffer pair 70 according to an embodiment of the present invention. The output buffer pair 70 may be used in a display driving circuit. The output buffer pair 70 includes operational amplifiers 700 and 702. The operational amplifiers 700 and 702 have a structure similar to the operational amplifier 10 of FIG. 1, and respectively include two output current paths among which a supply current path is selected. The operational amplifier 700 may receive an input voltage $V_{IN,n}$ and output an output voltage $V_{OUT,n}$ via an output node $N_{OUT,n}$. The operational amplifier 702 may receive an input voltage $V_{IN,n+1}$ and output an output voltage $V_{OUT,n+1}$ via an output node $N_{OUT,n+1}$.

In the output buffer pair 70, the voltages VDD, $VSP_n$, VCOM and $VSP_{n+1}$ are positive voltages. The voltages GND is a ground voltage. The voltage VCOM may be set to a middle voltage between VDD and GND. The voltage $VSP_n$ is lower than the voltage VDD and is higher than the voltage VCOM. The voltage $VSP_{n+1}$ is lower than the voltage VCOM and is higher than the voltage GND. For example, VDD may be +18V, GND may be 0V, VCOM may be +9V, and $VSP_n$ and $VSN_{n+1}$ may be constant voltages, or variable voltages determined based on digital display data.

According to the selecting signals $SEL_n$ determined based on the input voltage $V_{IN,n}$ (or corresponding digital display data), the operational amplifier 700 may be capable of selectively providing a supply current from the power supply source supplying VDD or from the power supply source supplying $VSP_n$, to a load coupled to the output node $N_{OUT,n}$. According to the selecting signals $SEL_{n+1}$ determined based on the input voltage $V_{IN,n+1}$ (or corresponding digital display data), the operational amplifier 702 may be capable of selectively providing a supply current from the power supply source supplying VCOM or from the power supply source supplying $VSP_{n+1}$, to a load coupled to the output node $N_{OUT,n+1}$. By using the output buffer pair 70 in the display driving circuit, power consumption of charging to the load coupled the output node $N_{OUT,n}$ and power consumption of charging to the load coupled the output node $N_{OUT,n+1}$ may be reduced.

It is noted that FIG. 1 to FIG. 3 which illustrate the operational amplifier having two output current paths for supply current and/or two output current paths for sink current are some of embodiments. Based on the use of selective multiple output current paths, the number of output current paths is not limited to two paths, and may be three or more paths if required. The selecting signal may have multiple values (e.g., 2-bits value) capable of indicating more than two output current paths respectively coupled to power supply source supplying different voltages, and the value of the selecting signal may be determined according to the voltage range which the input voltage is in.

By using the operational amplifier according to the embodiments of the present invention, the power consumption of charging to the load and/or the power consumption of discharging from the load may be reduced adaptively according to the digital display data. In addition, by using the operational amplifier according to the embodiments of the present invention in the display driving circuit, the charging period does not need to be divided into two sub-periods and the pre-charge circuit may be not necessary in the display driving circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier, comprising:
   an output node;
   an output stage, comprising a plurality of output current paths and a plurality of control nodes, wherein the plurality of control nodes are respectively coupled to the plurality of output current paths, and the plurality of output current paths are coupled to the output node and respectively coupled to a plurality of power supply sources providing different voltages; and
   a selecting unit, configured to selectively couple an internal output node of the operational amplifier to one of the plurality of control nodes of the output stage;
   wherein the operational amplifier is an output buffer of a display driving circuit.

2. The operational amplifier of claim 1, wherein one of the plurality of output current paths is selected to provide a supply current to a load.

3. The operational amplifier of claim 1, wherein one of the plurality of output current paths is selected to provide a sink current drained from a load.

4. The operational amplifier of claim 1, wherein when one of the plurality of output current paths is selected to provide an output current, other output current paths not selected are configured to not conducted.

5. The operational amplifier of claim 1, wherein at least one of the plurality of power supply source provides a voltage determined according to a plurality of digital display data.

6. The operational amplifier of claim 1, wherein the selecting unit is controlled by a selecting signal generated according to a digital display data which is converted into an input voltage to be outputted to the operational amplifier.

7. The operational amplifier of claim 6, wherein the selecting signal is generated according to the most significant bit of the digital display data.

8. The operational amplifier of claim 6, wherein the selecting signal is generated according to a determination result that is generated by determining a voltage range where the input voltage is.

9. The operational amplifier of claim 1, wherein the plurality of output current paths respectively comprise transistors of the same channel type, and each of the plurality of control nodes is coupled to a gate of a transistor in each output current path.

* * * * *